United States Patent
Aubauer et al.

(10) Patent No.: US 9,857,828 B2
(45) Date of Patent: Jan. 2, 2018

(54) ELECTRODE ARRANGEMENT FOR GESTURE DETECTION AND TRACKING

(71) Applicant: Microchip Technology Germany GmbH, Rosenheim (DE)

(72) Inventors: Roland Aubauer, Wessling (DE); Andreas Dorfner, Munich (DE)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 27 days.

(21) Appl. No.: 14/830,355

(22) Filed: Aug. 19, 2015

(65) Prior Publication Data

US 2016/0054754 A1    Feb. 25, 2016

Related U.S. Application Data

(60) Provisional application No. 62/039,734, filed on Aug. 20, 2014.

(51) Int. Cl.
*G06F 3/041* (2006.01)
*G06F 3/044* (2006.01)
(Continued)

(52) U.S. Cl.
CPC ............ *G06F 1/16* (2013.01); *G06F 3/017* (2013.01); *G06F 3/044* (2013.01); *G06F 3/0416* (2013.01);
(Continued)

(58) Field of Classification Search
CPC .......... G06F 1/16; G06F 3/017; G06F 3/0416; G06F 2203/04102; G06F 2203/04103;
(Continued)

(56) References Cited

U.S. PATENT DOCUMENTS 6,043,810 A  * 3/2000  Kim .................. G06F 3/045
                                                    345/173
2008/0309627 A1* 12/2008 Hotelling .......... G02F 1/134363
                                                    345/173

(Continued)

FOREIGN PATENT DOCUMENTS

WO    00/73984 A1   12/2000  ............. G06F 3/033
WO    2004/013833 A2  2/2004  ............. G06F 3/033

OTHER PUBLICATIONS

Le Goc, Mathieu et al., "A Low-Cost Transparent Electric Field Sensor for 3D Interaction on Mobile Devices," Human Factors in Computing Systems, ACM, pp. 3167-3170 (4 pages), Apr. 26, 2014.

(Continued)

*Primary Examiner* — Antonio Xavier
(74) *Attorney, Agent, or Firm* — Slayden Grubert Beard PLLC

(57) ABSTRACT

An electrode arrangement has a matrix with rows and columns of capacitive touch sensors arranged in a single layer, wherein each touch sensor has a first electrode and an associated second electrode, wherein the first electrodes in each row of the matrix are connected and the second electrodes in each column of the matrix are connected, and wherein the electrode arrangement further has a capacitive coupling operable to feed an alternating transmission signal only to the top and bottom row of connected first electrodes and to the most left and most right column of connected second electrodes.

23 Claims, 6 Drawing Sheets

(51) Int. Cl.
*G06F 1/16* (2006.01)
*G06F 3/01* (2006.01)
*H05K 1/02* (2006.01)

(52) U.S. Cl.
CPC ... *H05K 1/028* (2013.01); *G06F 2203/04101* (2013.01); *G06F 2203/04102* (2013.01); *G06F 2203/04103* (2013.01); *G06F 2203/04107* (2013.01); *G06F 2203/04108* (2013.01); *G06F 2203/04112* (2013.01)

(58) Field of Classification Search
CPC . G06F 2203/04107; G06F 2203/04108; G06F 2203/04112; G06F 2203/04101; H05K 1/028
See application file for complete search history.

(56) References Cited

U.S. PATENT DOCUMENTS

| | | | | |
|---|---|---|---|---|
| 2010/0079387 A1* | 4/2010 | Rosenblatt | ............ | G06F 1/1626 345/173 |
| 2011/0267296 A1* | 11/2011 | Noguchi | ............... | G06F 3/0412 345/173 |
| 2012/0057312 A1 | 3/2012 | Yoo et al. | ................ | 361/749 |
| 2012/0081328 A1 | 4/2012 | Kandziora et al. | ............ | 345/174 |
| 2012/0313882 A1* | 12/2012 | Aubauer | ................ | G06F 3/046 345/174 |
| 2013/0146333 A1* | 6/2013 | Cheng | ................... | H05K 3/064 174/250 |
| 2013/0147833 A1* | 6/2013 | Aubauer | ............... | G06F 3/0416 345/619 |
| 2013/0194519 A1* | 8/2013 | Ivanov | ................ | G02F 1/13338 349/12 |
| 2014/0152621 A1* | 6/2014 | Okayama | ............... | G06F 3/0416 345/174 |
| 2014/0192027 A1* | 7/2014 | Ksondzyk | .............. | G01N 27/22 345/178 |
| 2014/0210765 A1 | 7/2014 | Peng | ............................. | 345/174 |
| 2014/0375580 A1* | 12/2014 | Peshkin | .................. | G06F 3/016 345/173 |

OTHER PUBLICATIONS

International Search Report and Written Opinion, Application No. PCT/EP2015/069192, 12 pages, dated Apr. 21, 2015.
"MGC3130: Single-Zone 3D Tracking and Gesture Controller Data Sheet," Microchip Technology Incorporated, 46 pages, Oct. 28, 2013.
International Search Report and Written Opinion, Application No. PCT/EP2015/069191, 10 pages, dated Oct. 20, 2015.
Non-Final Office Action, U.S. Appl. No. 14/829,031, 21 pages, dated Feb. 27, 2017.
U.S. Final Office Action, U.S. Appl. No. 14/829,031, 23 pages, dated Jul. 7, 2017.

* cited by examiner ously owned U.S.
ELECTRODE ARRANGEMENT FOR GESTURE DETECTION AND TRACKING

RELATED PATENT APPLICATION

This application claims priority to commonly owned U.S. Provisional Patent Application No. 62/039,734 filed Aug. 20, 2014, which is hereby incorporated by reference herein for all purposes.

TECHNICAL FIELD

The present disclosure relates to capacitive sensing systems and method of operating such, in particular to an electrode arrangement for a capacitive sensing system using electric field effects.

BACKGROUND

The "GestiC©" integrated circuit, also known as MGC3130 manufactured by the assignee of this application, is a highly sensitive capacitive sensing technology that can be used for three-dimensional touch-less gesture detection and tracking using a quasi-static alternating electric near field, for example around 100-200 kHz. Such a system usually uses a transmitting electrode receiving an alternating signal such as a sinusoidal or square wave signal to generate the electric field. A plurality of receiving electrodes are arranged, for example, above the transmitting electrode in a frame like fashion, and from received signals a three-dimensional position of an object can be reconstructed within an integrated circuit device through signal processing.

Human interface devices (HID) that use such an integrated circuit device require sensor electrodes that are often formed in layers of conductive material, e.g. stripes of copper of a printed circuit board layer (PCB). These electrodes are electrically connected to a detection unit in the integrated circuit. For a detection system a conventional electrode arrangement can be formed on a multi-layer printed circuit board, wherein the bottom layer is often in its entirety or a significant portion of it used as a transmitter and smaller receiving electrodes and compensation electrodes can be formed on the top layer. More than two layers can be provided to build an electrode which also may increase the manufacturing cost for such electrode arrangements.

The gesture detection unit's measurement value, among others, depends on the position of a target object (finger/hand) in the sensor electrode's vicinity which influences the capacitive coupling between electrode and target, yielding a target measurement signal depending on the distortion of the alternating electric field. The gestures are performed above a detection area without touching any area of the respective device. In addition, touch detection may also be required for performing/initiating certain functions of the device.

Flatness of the industrial design and manufacturing costs are driving projective capacitive touch displays in consumer and other industries. Today, an increasing number of touch panels in consumer display applications are single-layer electrode designs, which are easier to manufacturer, achieve higher yields, are thinner and of significant lower cost. Furthermore single layer designs may offer better optical characteristics (higher transparency). Today's two layer GestIC© electrode design is a barrier accessing such early mass volume markets with 3D hand position tracking and gesture recognition.

SUMMARY

Hence, there is a need for a less expensive electrode arrangement. According to an embodiment, an electrode arrangement may comprise a matrix with rows and columns of capacitive touch sensors arranged in a single layer, wherein each touch sensor comprises a first electrode and an associated second electrode, wherein the first electrodes in each row of the matrix are connected and the second electrodes in each column of the matrix are connected, and wherein the electrode arrangement further comprises a capacitive coupling operable to feed an alternating transmission signal only to the top and bottom row of connected first electrodes and to the most left and most right column of connected second electrodes.

According to a further embodiment, the capacitive coupling may comprise first, second, third, and fourth capacitors, wherein a first terminal of the first capacitor is connected to the top row electrodes, a first terminal of the second capacitor is connected to the bottom row electrodes, a first terminal of the third capacitor is connected to the most left column electrodes, and a first terminal of the fourth capacitor is connected to the most right column electrodes, and wherein second terminals of the first, second, third, and fourth capacitors are connected together and receive the alternating transmission signal. According to a further embodiment, the electrode arrangement may further comprise a contact area comprising a plurality of feeding lines configured to provide electrical connection to the rows and columns. According to a further embodiment, the electrode arrangement may further comprise a substrate on a top side of which the first and second electrodes are arranged. According to a further embodiment, the substrate can be a flexible substrate. According to a further embodiment, the electrode arrangement may further comprise a switching circuitry which in a first operating mode couples the rows and columns with a touch detection device and in a second operating mode couples the top row, bottom row, most left column, and most right column, respectively with respective inputs of a non-touching gesture detection device. According to a further embodiment, the first and second electrodes may operate as projective capacitive touch sensors in the first operating mode. According to a further embodiment, four electrodes may be formed by the top row, bottom row, most left column, and most right column receive a continuous alternating transmission signal through the capacitive coupling during the second operating mode and are evaluated by determining a loading of each of the four electrodes. According to a further embodiment, in the second operating mode unused electrodes are switched together to receive the alternating transmission signal. According to a further embodiment, the first and second electrodes are each comb shaped and arranged in interdigital fashion.

According to another embodiment, a sensor arrangement may comprise an electrode arrangement as described above, wherein the electrode arrangement is further arranged on top of a substrate and comprises a connection area comprising a plurality of feeding lines configured to connect the rows and column electrodes with a connector.

According to a further embodiment, the sensor arrangement may further comprise a controller connected with the feeding lines, wherein the controller is configured to operate in first mode or in a second mode, wherein the first mode uses electrode formed by the top row, bottom row, most right column, and most left column for a touch-less gesture detection and the second mode uses the first and second electrodes as projective capacitive touch sensors for a touch based detection mode.

According to yet another embodiment, a method for operating a sensor arrangement comprising a matrix with rows and columns of capacitive touch sensors arranged in a single layer, wherein each touch sensor comprises a first electrode and an associated second electrode, wherein the first electrodes in each row of the matrix are connected and the second electrodes in each column of the matrix are connected, may comprise the steps of: in a first operating mode, during a measurement cycle, feeding a continuous alternating transmission signal through a capacitive coupling only to gesture detection electrodes formed by top and bottom row of connected first electrodes and most left and most right column of connected second electrodes, and evaluating a loading of the gesture detection electrodes by processing signals from the gesture detection electrodes to determine a three-dimensional location of an object entering an electric field created by the gesture detection electrodes; and in a second operating mode, turning off the alternating transmission signal and measuring a capacitance of each capacitive touch sensor to determine whether a capacitive touch sensor has been touched.

According to a further embodiment of the above method, in the first mode the alternating transmission signal is also fed capacitively to each otherwise unused first and second electrode of the matrix.

DETAILED DESCRIPTION

Figure 1:
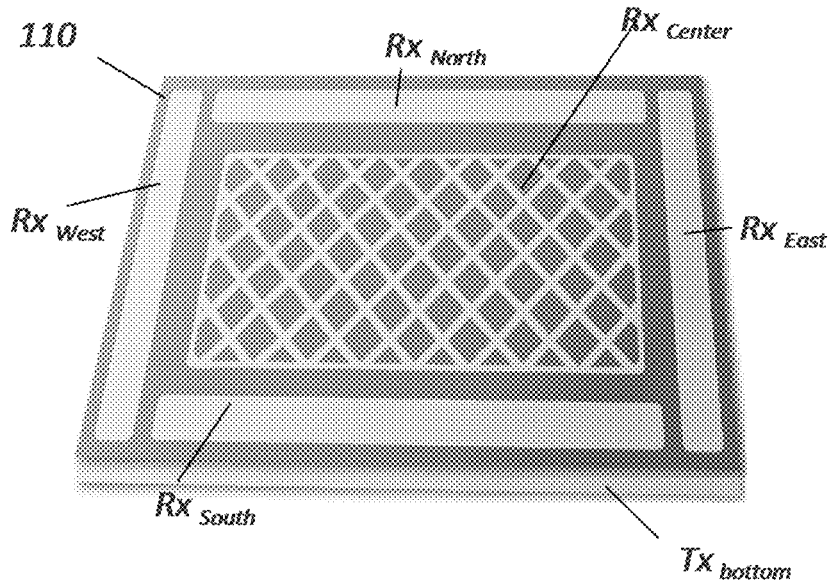
FIGS. 1 and 2 show conventional sensor arrangements for capacitive three-dimensional gesture detection.

According to various embodiments, a sensor arrangement, in particular a sensor arrangement for a non-touching three dimensional gesture detection system using effects of an quasi-static alternating electric near field can be designed that provides for lower material and manufacturing costs, thinner sensor designs, and a better optical performance of transparent designs.

As mentioned above, a three-dimensional capacitive non-touching detection system generates a quasi-static electric field wherein disturbances in that field caused by an object entering it are evaluated. The evaluation allows it to determine a three-dimensional location of the object, such as a finger of a user, and to track its position to further determine whether a gesture from a predefined pool of gestures has been performed. Such a system can also operate as a three-dimensional touchless mouse or control any kind of suitable operations. Such a system usually uses a transmitting electrode receiving an alternating signal such as a sinusoidal or square wave signal, for example having a frequency of 100-200 kHz, to generate the quasi-static alternating electric field. Contrary to, for example, mutual or self capacitance measurements, the transmitting electrode is supplied permanently with the generator signal and disturbances in the generated field are measured while the field is permanently upheld during a measurement. The system does not evaluate single pulses, voltages generated by single or multiple pulses and associated charge changes of the sensor electrodes as it is common in capacitance measurement systems, for example, a capacitive voltage divider or a charge time measurement unit used for mutual or self capacitance measurements. In some embodiments, a plurality of receiving electrodes are arranged, for example in a frame-like fashion to evaluate the quasi-static electric field generated by the transmitting electrode, and from received signals a three-dimensional position of an object can be reconstructed within an integrated circuit device through signal processing. In other embodiments, the same electrodes are used for transmitting and receiving and while still the same electric field is generated, the evaluation measures a load on each transmitter/receiver electrode caused by a disturbance in the electric field.

The various embodiments disclosed provide solutions to eliminate one of two electrode layers in an electrode design, such as for example an electrode arrangement for Microchip's GestIC© 3D hand tracking and gesture recognition technology. However, the disclosed design may be useful for other type of sensor devices and is not limited to the GestIC© 3D hand tracking and gesture recognition technology. According to various embodiments, techniques will be described of how TX and RX electrodes can be integrated in only one single electrode layer. The described techniques apply to any electrode system using similar electrode designs as proposed for the GestIC© system but are not limited to such a system. Further on, solutions are disclosed how single layer electrodes can be integrated into one layer projected capacitive (pCAP) touch matrix designs.

Figure 2:
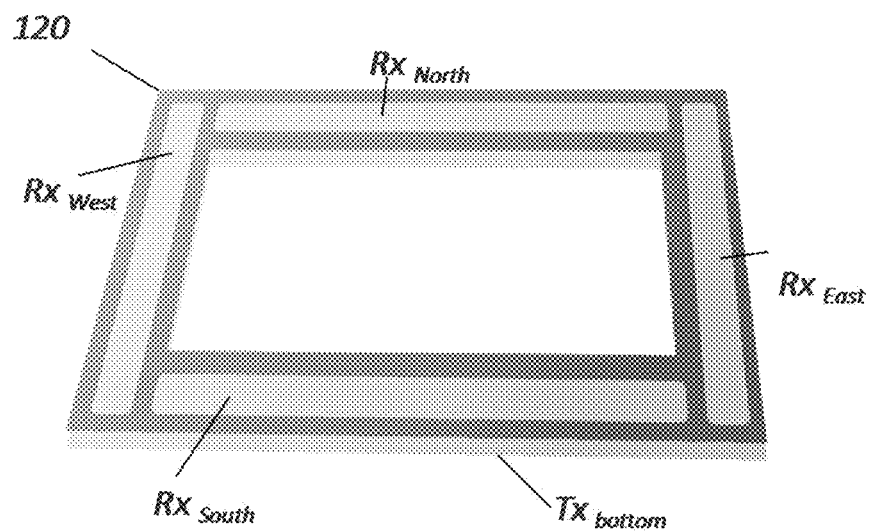

FIGS. 1 and 2 shows a conventional two-layer electrode arrangement. The design shown in FIG. 1 includes a center receiving electrode $RX_{Center}$ whereas the embodiment shown in FIG. 2 uses a frame design with an open center area. In both designs, there are four receiving electrodes $RX_{North}$, $RX_{East}$, $RX_{South}$, and $RX_{West}$ at different top layer locations which provide spatial information about an object, e.g., a hand, that performs a gesture in an area above the electrode arrangement. These receiving electrodes (RX) receive an alternating electric field generated by an underlying transmission electrode $TX_{bottom}$. Non-conductive carrier material 110, 120 (e.g. of plastic, PCB material, glass, etc.) isolates the RX electrodes from the transmission electrode(s) (TX). TX electrode $TX_{bottom}$ in the bottom layer both excites the E-field and shields the RX electrodes from backside noise. The electric field can for example be generated by a 100 kHz square-wave signal fed to the TX electrode $TX_{bottom}$. A respective electric field is then projected by the transmission electrode $TX_{bottom}$ in an area, for example, approximately up to 10-15 cm, above the carrier material 110, 120. A user performing a gesture, e.g. with his/her hand, within this area disturbs the electric field and these disturbances can be detected by the four RX electrodes $RX_{North}$, $RX_{East}$, $RX_{South}$, and $RX_{West}$. From the received signals, a three-dimensional position can be processed. The signal deviation, the first and second derivation as well as the calculated, linearized distance to each electrode can be used to perform a gesture comparison/evaluation.

Figure 3:
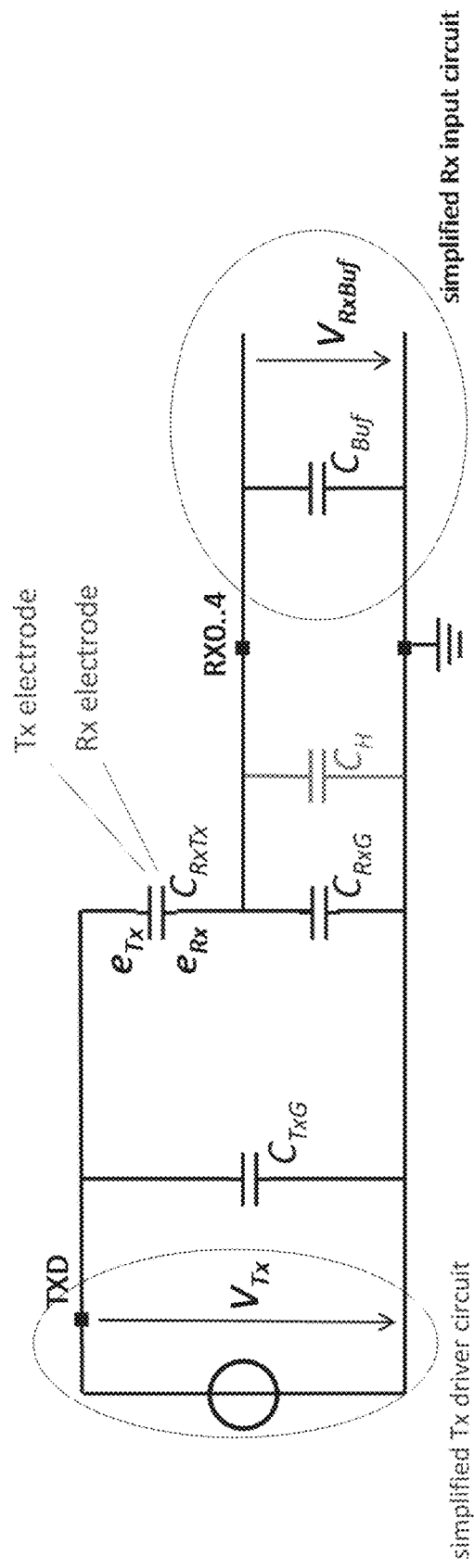
FIG. 3 shows a simplified equivalent circuit of a sensor arrangement according to FIG. 1 or 2.

FIG. 3 shows a simplified equivalent circuit. $C_{RxTx}$ represents the capacitance between an RX and the TX electrode and can be around 10-30 pF. $C_{RxG}$ represents the capacitance from an RX electrode to ground and can be around 10-30 pF. CH represents the capacitance between a user hand and an RX electrode and can be around 1 fF-1 pF. $C_{Buf}$ represents a high impedance input capacitance of an RX input buffer coupled with the electrode and can be around 6 pF.

A non-touching near field detection system, such as the one used in GestIC© technology, measures the RX input amplitude change caused by the influence of the users hand to the electrical field excited via the TX electrode. Design target is to maximize the signal deviation of the received signal.

In two layer electrode designs the stacked electrode setup provides both good shielding of the RX electrodes to subjacent noise sources such as electronic circuits and liquid crystal displays and to ground in general.

In an optimum electrode design $C_{RxTx}$ and $C_{RxG}$ capacitances are small and of similar size. This scenario is described, for example, in "GestIC© Design guide, Electrodes and System Design MGC3130", available from Microchip Technology Inc. and incorporated hereby by reference, wherein the lower limit of $C_{RxG}$ is the input capacitance of the detection circuit (e.g. 4-5 pF). In the two layer design the Rx-TX electrode distance and a low permittivity of the insulating carrier material allow small $C_{RxTx}$, wherein the shielding TX layer assures for small $C_{RxG}$ values representing the RX electrode capacitance to ground.

In the Single Layer Design according to various embodiments, where TX and RX electrodes are per definition in the same layer sufficient E-field propagation in the z-dimension must be ensured.

TX electrodes for these type of detection circuits can, according to various embodiments, be:
a) Separate TX structures in the same layer as the RX electrodes;
b) The RX electrodes itself;
c) The electrode structure of capacitive or resistive touch panel in the same layer.

In single layer designs, the routing of feeding lines is particularly important since interlayer through hole connections aren't possible by definition. Optimum designs do not have any feeding line intersections at all. The proposed various embodiments show examples of how to realize such designs.

Bridges can be allowed in certain electrode technologies, e.g. ITO on foil or glass, printed foils, etc.. However, such technologies are expensive. Bridges can be realized on the flex cable connecting the electrode board. Furthermore, bridges can be realized on the PCB and the chip connected to the electrodes.

Figure 4:
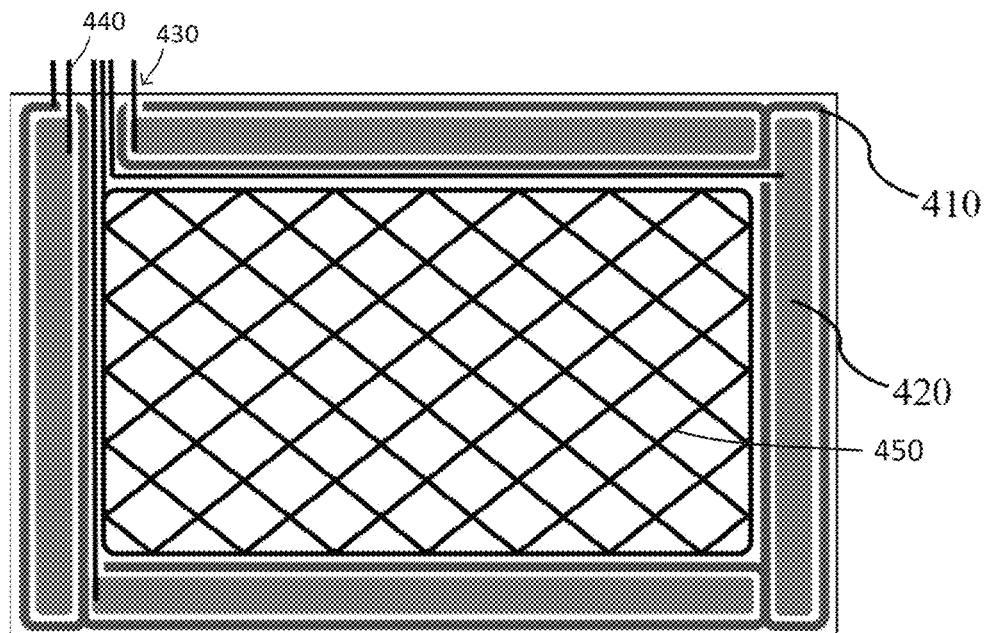
FIG. 4 shows a first embodiment of a one-layer sensor arrangement with a grid shaped center electrode.

The design of FIG. 4 shows a solution of integrating the TX electrode into the RX electrode layer. The TX electrode 410 flow ring-like around the RX electrodes 420 from both sides to lower ground influences. One interruption 430 of the TX ring 410 per RX electrode 420 allow the connection of the respective RX electrode feeding line 440. Only one RXfeeding line 440 per electrode is required as shown in FIG. 4.

The TX rings 410 around each RX electrode 420 shield ground from outside device parts, e.g. a metal housing and thus maintain sensitivity. Compared to a conventional design, for example a GestIC© design as shown in FIGS. 1 and 2, the TX electrode ring 410 provides no shielding from ground underneath. To maintain about similar $C_{RXTX}$ and $C_{RXG}$ values as mentioned above, the TX ring 410 must be closer to the RX electrodes 420 for smaller ground distances underneath the RX electrode 420. Ground can be, e.g., a display below a transparent one-layer electrode structure.

Figure 5:
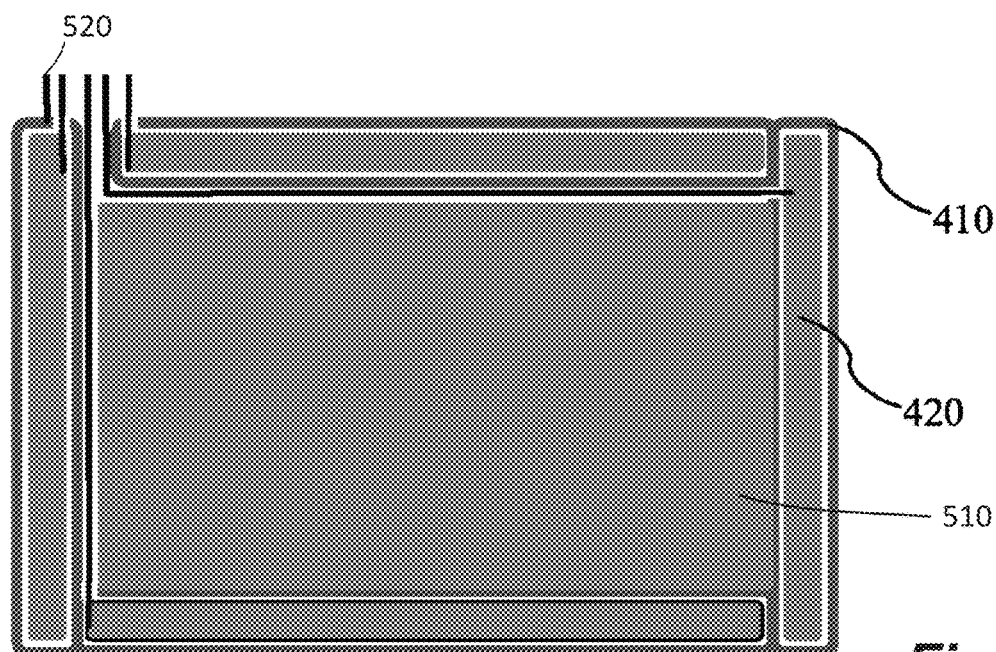
FIG. 5 shows a second embodiment of a one-layer sensor arrangement with a transmission center electrode.

The individual frame electrode TX rings 410 form also the TX structure for an optional RX center electrode 450 as for example used in a GestIC© design. In case no RX center electrode is required, e.g. for center touch detection, the center area can be advantageously filled by the TX electrode 510 as shown in FIG. 5. The E-field distribution and the sensitivity of the system increases. In the proposed design of FIG. 5 only one TX feeding line 520 is required. The center electrode 510 is directly connected to the ring structure 410 surrounding electrode 420 and/or any other accessible ring structure as shown in FIG. 5.

Figure 6:
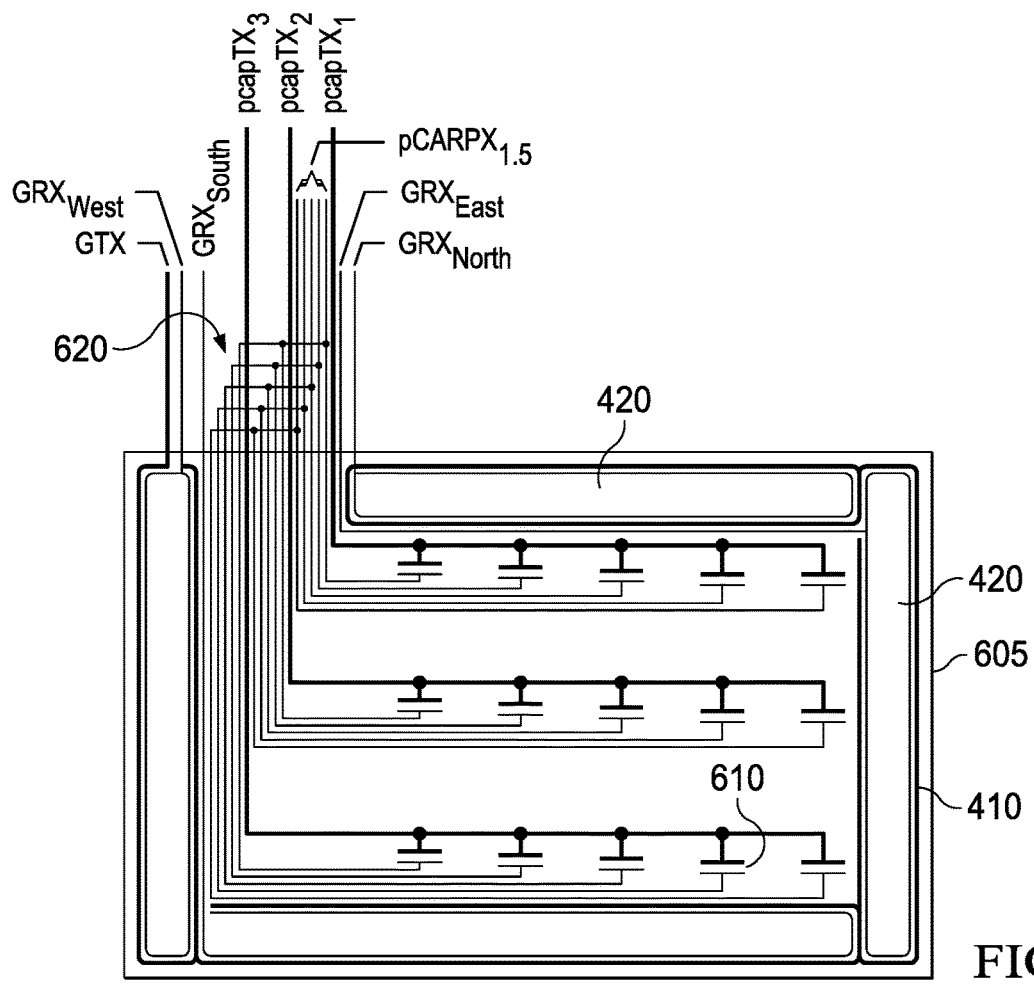
FIG. 6 shows a third embodiment of a one-layer sensor arrangement with a plurality of projected capacitive touch sensors electrodes.

According to some embodiments, a complete one-layer projective capacitive touch matrix can be integrated in the center area of such a frame electrode structure as shown in FIG. 6. All electrode feeding lines from near field receiving electrodes 420 and the interior pCAP electrodes 610 are routed through one corner 620 without any intersection. This design saves costs since it requires only one connector from the electrodes to the electronic circuit board and doesn't require bridges on the one layer electrode board or glass 605. Any necessary connection can be formed on the controller PCB or within the connector as indicated in FIG. 6.

The required bridges for the pCAP matrix to form electrodes columns and rows are made either on the flex connector, the electronic circuit board (PCB) and the touch controller chip according to the state of the art. In FIG. 6 connections are shown by dots. All other crossing require bridges.

In case of time-multiplexed operation between PCAP and GestIC© to avoid interference between both measurements, the complete touch matrix may be driven with the GTX signal during GestIC© operation (GTX is in the following the GestIC© TX transmission signal). Thus the touch electrodes 610 are switched together to form a single transmission electrode connected to the ring structure 410. This switching is performed external to the board 605, e.g., by respective switching circuitry. This has the advantage of a defined and strong E-field during GestIC© operation and fastest handover between pCAP and GestIC©. No remaining charges on the pCAP electrodes 610 may influence the very sensitive GestIC© measurement. Typically an analog multiplexer which can be internal on the controller chip may be used to allow this operation mode. E.g., the GestIC© chip or any other suitable touchless detection device may be designed to perform this function, or it may be implemented externally using, for example, analog multiplexer chips.

Figure 7:
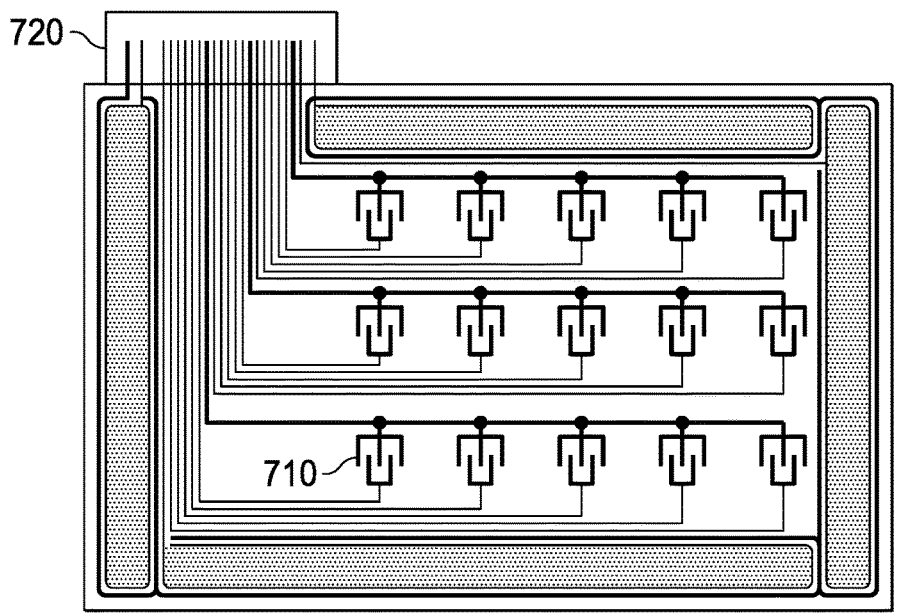
FIG. 7 shows a fourth embodiment of a one-layer sensor arrangement with a plurality of projected capacitive touch sensors electrodes.

FIG. 7 shows another example of a pCAP one layer touch matrix design in combination with the one-layer electrode arrangement. The pCAP TX and RX electrodes 710 are realized as comb structures here. FIG. 7 further shows that the substrate 605 can be extended or designed to provide for a connector section 720 that allows for connection of the individual feeding lines that connect to the transmitting electrode, the receiving electrodes and the plurality of pCAP electrodes 710.

The substrate 605 in any embodiment can be a rigid printed circuit board comprising and area that receives the connector 720 or may comprise a section 720 that directly forms a printed circuit connector as known in the art. Alternatively, the substrate can be a flexible substrate that provides either for a connector or the flexible PCB forms a connection section 720 that can be inserted into a connector.

Figure 8:
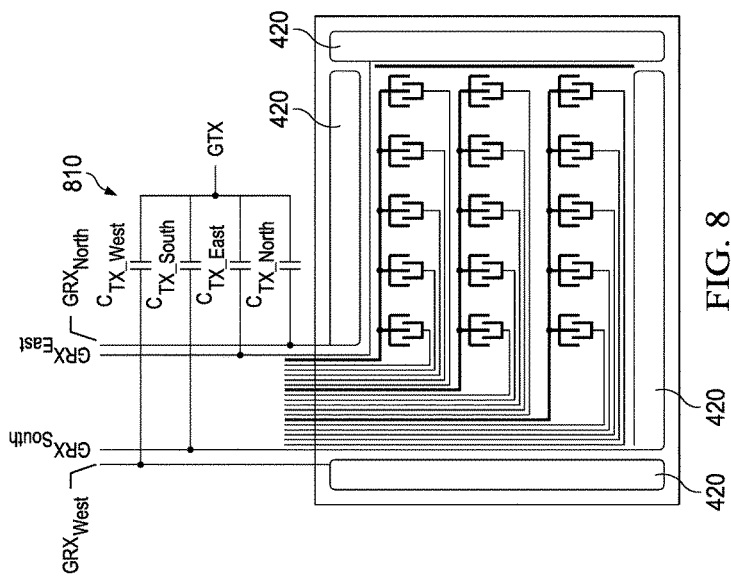
FIG. 8 shows a first embodiment of a sensor circuit using a one-layer sensor arrangement with a plurality of projected capacitive touch sensors electrodes.

Yet another solution according to some embodiments is shown in FIG. 8 and is the discrete realization of the RX-TX capacitance of the GestIC© system. The TX signal is coupled onto the RX electrodes 420 via discrete $C_{TX}$ coupling capacitances 810 for each electrode 420. The $C_{TX}$ capacitances 810 can be either discrete components or integrated on the GestIC© chip. To fulfill the optimization criteria ($C_{TX}=C_{RXTX}$) equals $C_{RXG}$ the coupling capacitances $C_{TX\_North}$ to $C_{TX\_West}$ should be individually tunable (e.g. 5 pF, 10 pF, 15 pF, . . . , 50 pF). FIG. 8 shows that no dedicated TX electrode is required. The RX electrodes 420 distribute the E-field and are sensitive to the E-field changes caused by the users hand. Hence, each electrode 420 operates as a transmitter and receiver at the same time wherein the receiving function is performed by determining a load on each electrode 420. This solution is simpler and easier to realize because $C_{TX}$ tuning can be done by approximation. No E-field simulations are required to match $C_{RXTX}$ and $C_{RXG}$. On the other hand, ground shielding may be of lower effect because of the high impedance TX signal on the RX electrodes 420. Using the center area for a GestIC© touch area (GestIC© center electrode 450) and for a pCAP matrix (610, 710) is the same as for the solutions before.

Figure 9:
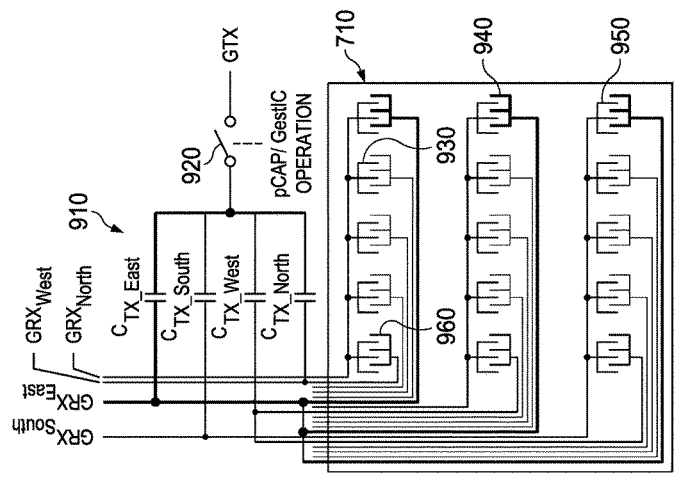
FIG. 9 shows a second embodiment of a sensor circuit using a one-layer sensor arrangement with a plurality of projected capacitive touch sensors electrodes.

As shown in the embodiments of FIGS. 7 and 8, a pCAP electrode 710 is formed by an upper and lower comb-like structure arranged in an interdigital fashion. Such pCAP electrodes 710 can be arranged in a matrix as shown in FIGS. 7-9. By combining certain upper and lower electrodes rows and columns can be formed which can be used for a dual function. In a gesture detection mode (also referred to GestIC©-mode hereinafter), an entire row or column can be separately used to form an electrode similar to electrode 420. In pCAP-mode these electrodes are used as originally intended. Switching circuitry, which is preferably arranged outside the sensor board can then be used to operate the panel in either mode.

FIG. 9 shows how a single layer touch matrix, with for example, 15 pCAP sensors 710, can be shared between pCAP-mode and GestIC© signal acquisition mode. Here, the GestIC© electrodes are formed by the elements of the comb structure electrodes and then used as transmitting and receiving structures. Each pCAP sensor 710 consists of an upper and lower comb structured electrode. The upper electrodes of the top row are connected together to form the NORTH electrode 930. The lower elements of the last pCAP sensors in each row are connected together to form the EAST electrode 940. The upper pCAP electrodes of the bottom row are connected to form the SOUTH electrode 950 and the lower electrodes of each first pCAP electrode in each row are connected together to form the WEST electrode 960. This connection scheme still allows to evaluate each pCAP electrode pair separately when the system operates in pCAP-mode due to the fact that the lower electrodes are connected to form columns and the upper electrodes are connected to form rows. The gesture detection TX signal GTX can be coupled via a switch 920 capacitivly into the gesture detection GRX electrodes (here $C_{TX\_East}$, $C_{TX\_South}$, $C_{TX\_West}$, $C_{TX\_North}$) when the system operates in gesture detection mode.

Those outer electrodes 930 . . . 960 are used as outputs in gesture detection mode and must be set to high impedance during pCAP measurement. This can be done by an analog switch/multiplexer circuit that turns off the GTX signal.

The advantage of this solution is a more compact electrode design where the active pCAP touch area is up to the boundaries. In this design it may be necessary to assure that the electrode pattern (e.g. comb) is more sensitive than the longer feeding lines. Therefore the surface of the feeding line should be much smaller than the one of the electrode. In general, feeding lines should be very thin (e.g. using "Nanowire" technology).

Figure 10:
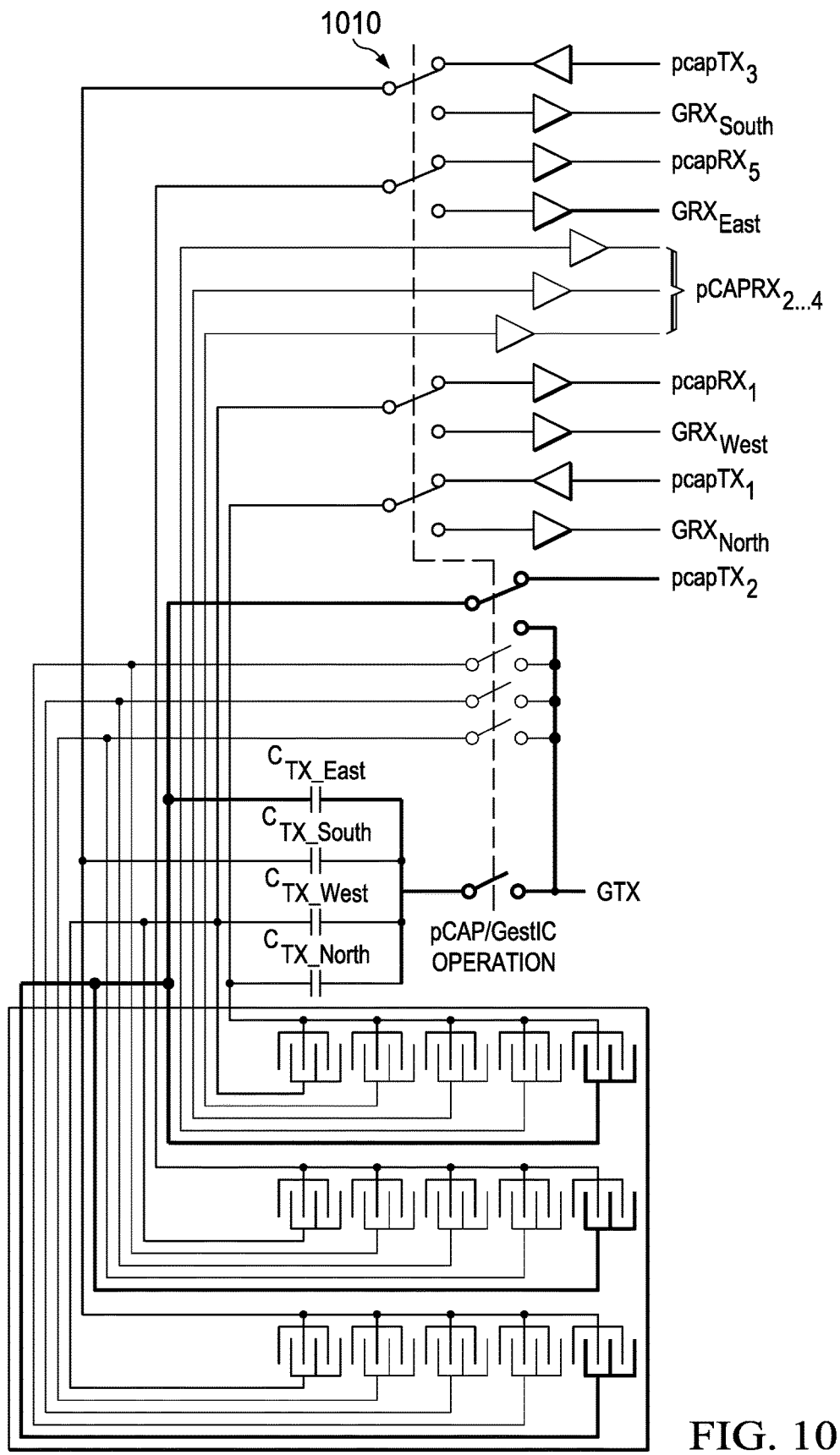
FIG. 10 shows a third embodiment of a sensor circuit using a one-layer sensor arrangement with a plurality of projected capacitive touch sensors electrodes.

With respect to FIG. 10, to achieve a high GestIC©-mode sensitivity, it can be advantageous again that the inside electrode area is driven with transmission signal GTX during a GestIC©-mode operation which provides better shielding against ground and better E-field distribution in the z-direction. By this method remaining charges on the inner electrodes from pCAP operation are effectively put to a defined potential and no transfer effects between pCAP-mode and GestIC©-mode occur.

The switches/analog multiplexers 1010 as shown in FIG. 10 show how the electrodes can be switched between pCAP and GestIC© operation. In general, GestIC© GTX and pcapTX can be different signals according to some embodiments. For simplicity reasons (lower HW and FW complexity) both signals can be the same, too according to other embodiments.

In FIG. 10, different input stages are shown for pCAP-mode and GestIC©-mode operation. It is also possible to use (partly) the same input and signal conditioning circuits for GestIC©-mode and pCAP-mode.

According to various embodiments, various electrode arrangements can be used for touch panel and display applications (e.g., up to 10" in diagonal) with, for example, an MGC3130 and successor 3D gesture and touch controllers, e.g. MGC3430. As mentioned above, the GestIC©-technology is used in most examples to implement a touchless gesture detection system. However, the various embodiments are not limited to such a system. Other systems that generate a quasi-static alternating electric field and detect disturbances as well as other capacitive 3D detection system may benefit from a similar sensor arrangement.

The invention claimed is:

1. An electrode arrangement comprising:
a matrix with rows and columns of capacitive touch sensors arranged in a single layer, wherein each touch sensor comprises a first electrode and an associated second electrode, wherein the first electrodes in each row of the matrix are connected and the second electrodes in each column of the matrix are connected, and
a switch receiving an alternating transmission signal and being coupled with a capacitive coupling circuit connected with at least four electrodes of said matrix, wherein the capacitive coupling circuit receives an alternating transmission signal and feeds said alternating transmission signal capacitively to said at least four electrodes wherein said at least four electrodes generate an alternating electric field and at least four receiving signal lines are connected directly with said at least four electrodes for determining a load on each of the at least four electrodes, wherein the at least four electrodes operate as transmitter and receiver electrodes at the same time, wherein said at least four electrodes are formed by the top row of connected first electrodes, the bottom row of connected first electrodes, the most left column of connected second electrodes and the most right column of connected second electrodes.

2. The electrode arrangement according to claim 1, wherein the capacitive coupling circuit comprises first, second, third, and fourth capacitors, wherein a first terminal of the first capacitor is connected to the top row electrodes, a first terminal of the second capacitor is connected to the bottom row electrodes, a first terminal of the third capacitor is connected to the most left column electrodes, and a first terminal of the fourth capacitor is connected to the most right column electrodes, and wherein second terminals of the first, second, third, and fourth capacitors are connected together and receive the alternating transmission signal.

3. The electrode arrangement according to claim 1, further comprising a contact area comprising a plurality of feeding lines configured to provide electrical connection to the rows and columns.

4. The electrode arrangement according to claim 1, further comprising a substrate on a top side of which said first and second electrodes are arranged.

5. The electrode arrangement according to claim 4, wherein the substrate is a flexible substrate.

6. The electrode arrangement according to claim 4, further comprising a switching circuitry which in a first operating mode couples the rows and columns with a touch detection device and in a second operating mode couples the top row, bottom row, most left column, and most right column, respectively with respective inputs of a non-touching gesture detection device, wherein in the second operating mode electrodes formed by the top row, bottom row, most left column, and most right column operate as transmitting and receiving electrodes.

7. The electrode arrangement according to claim 6, wherein the first and second electrodes operate as projective capacitive touch sensors in the first operating mode.

8. The electrode arrangement according to claim 7, wherein four electrodes are formed by the top row, bottom row, most left column, and most right column to receive a continuous alternating transmission signal through the capacitive coupling circuit during the second operating mode and are evaluated by determining a loading of each of the four electrodes.

9. The electrode arrangement according to claim 6, wherein in the second operating mode certain electrodes of the matrix are switched together via a switch to receive the alternating transmission signal.

10. The electrode arrangement according to claim 1, wherein the first and second electrodes are each comb shaped and arranged in interdigital fashion.

11. A sensor arrangement comprising an electrode arrangement according to claim 1, wherein the electrode arrangement further is arranged on top of a substrate and comprises a connection area comprising a plurality of feeding lines configured to connect said rows and column electrodes with a connector.

12. The sensor arrangement according to claim 11, further comprising a controller connected with the feeding lines, wherein the controller is configured to operate in first mode or in a second mode, wherein the first mode uses electrode formed by the top row, bottom row, most right column, and most left column for a touch-less gesture detection and the second mode uses the first and second electrodes as projective capacitive touch sensors for a touch based detection mode.

13. The sensor arrangement according to claim 11, wherein the capacitive coupling circuit comprises first, second, third, and fourth capacitors, wherein a first terminal of the first capacitor is connected to the top row electrodes, a first terminal of the second capacitor is connected to the bottom row electrodes, a first terminal of the third capacitor is connected to the most left column electrodes, and a first terminal of the fourth capacitor is connected to the most right column electrodes, and wherein second terminals of the first, second, third, and fourth capacitors are connected together and receive the alternating transmission signal.

14. The sensor arrangement according to claim 11, further comprising a contact area comprising a plurality of feeding lines configured to provide electrical connection to the rows and columns.

15. The sensor arrangement according to claim 11, further comprising a substrate on a top side of which said first and second electrodes are arranged.

16. The sensor arrangement according to claim 15, wherein the substrate is a flexible substrate.

17. The sensor arrangement according to claim 15, further comprising a switching circuitry which in a first operating mode couples the rows and columns with a touch detection device and in a second operating mode couples the top row, bottom row, most left column, and most right column, respectively with respective inputs of a non-touching gesture detection device.

18. The sensor arrangement according to claim 17, wherein the first and second electrodes operate as projective capacitive touch sensors in the first operating mode.

19. The sensor arrangement according to claim 18, wherein four electrodes are formed by the top row, bottom row, most left column, and most right column to receive a continuous alternating transmission signal through the capacitive coupling circuit during the second operating mode and are evaluated by determining a loading of each of the four electrodes.

20. The sensor arrangement according to claim 17, wherein in the second operating mode certain electrodes are switched together via a switch to receive the alternating transmission signal in the gesture detection mode.

21. The sensor arrangement according to claim 11, wherein the first and second electrodes are each comb shaped and arranged in interdigital fashion.

22. A method for operating a sensor arrangement comprising a matrix with rows and columns of capacitive touch sensors arranged in a single layer, wherein each touch sensor comprises a first electrode and an associated second electrode, wherein the first electrodes in each row of the matrix are connected and the second electrodes in each column of the matrix are connected, the method comprising:
  in a first operating mode, during a measurement cycle feeding a continuous alternating transmission signal through a capacitive coupling circuit only to gesture detection electrodes formed by a top and a bottom row of connected first electrodes and a most left and a most right column of connected second electrodes, and evaluating a loading of said gesture detection electrodes by processing signals from the gesture detection electrodes to determine a three-dimensional location of an object entering an electric field created by the gesture detection electrodes wherein the gesture detection electrodes operate as transmitter and receiver electrodes at the same time wherein the sensor arrangement does not require an additional transmission electrode;
  in a second operating mode, turning off said alternating transmission signal and measuring a capacitance of each capacitive touch sensor to determine whether a capacitive touch sensor has been touched.

23. The method according to claim 22, wherein in said first mode the alternating transmission signal is also fed directly via a switch to predefined first and second electrodes of the matrix.

* * * * *